(12) United States Patent
Wickramanayaka

(10) Patent No.: US 6,225,746 B1
(45) Date of Patent: May 1, 2001

(54) PLASMA PROCESSING SYSTEM

(75) Inventor: Sunil Wickramanayaka, Tokyo (JP)

(73) Assignee: Anelva Corporation, Fuchu (JP)

( * ) Notice: Subject to any disclaimer, the term of this patent is extended or adjusted under 35 U.S.C. 154(b) by 0 days.

(21) Appl. No.: 09/489,610

(22) Filed: Jan. 21, 2000

(30) Foreign Application Priority Data

Mar. 3, 1999 (JP) ................................. 11-056067

(51) Int. Cl.$^7$ .................................................. H01J 7/24
(52) U.S. Cl. ............................. 315/111.51; 315/111.41; 156/345
(58) Field of Search .......................... 315/111.41, 111.51, 315/111.71

(56) References Cited

U.S. PATENT DOCUMENTS

| | | | |
|---|---|---|---|
| 4,918,031 | * | 4/1990 | Flamm et al. ..................... 315/39.51 |
| 5,292,396 | * | 3/1994 | Takashima et al. ................. 156/345 |
| 5,346,579 | * | 9/1994 | Cook et al. ............................ 156/345 |
| 6,095,084 | * | 8/2000 | Shamouilian et al. .......... 315/111.41 |

* cited by examiner

Primary Examiner—Don Wong
Assistant Examiner—Jimmy Vu
(74) Attorney, Agent, or Firm—Burns, Doane, Swecker & Mathis, LLP

(57) ABSTRACT

A plasma processing reactor includes a helical resonator including a top plate and a helical coil, the helical coil is made of a metal with a length of $\lambda/4$, wherein n is an integer and $\lambda$ is a wavelength of rf frequency applied to the helical coil. The reactor also includes a plasma process chamber including a wafer holder arranged at a lower position therein and a wafer to be processed is loaded on the wafer holder. The helical resonator has a vertical bar for introducing a gas, the vertical bar is fixed to the top plate of the helical resonator and is connected to a gas inlet port. A partition wall separates the helical resonator and the plasma process chamber. The partition wall includes an outer metal ring, a circular central metal plate, and a doughnut-shaped dielectric plate between the outer metal ring and the central metal plate, the doughnut-shaped dielectric plate having an inner diameter and an outer diameter. The central metal plate is fixed to the top plate using the vertical bar and includes a gas reservoir and a plurality of gas inlet ports. The helical coil is placed around the vertical bar, and the helical coil has a diameter that is greater than the inner diameter of the doughnut-shaped dielectric plate and is smaller than the outer diameter of the doughnut-shaped dielectric plate.

18 Claims, 7 Drawing Sheets

PLASMA PROCESSING SYSTEM

CROSS-REFERENCE TO RELATED APPLICATIONS

The present application corresponds to and claims the priority of Japanese Patent Application No. 11-56067, filed in Japan on Mar. 3, 1999, and the entire contents of which are hereby incorporated herein by reference.

BACKGROUND OF THE INVENTION

1. Field of Industrial Application

The present invention relates to a plasma processing system having an improved plasma source capable of supplying ions, electrons, neutral radicals and ultra-violet and visible light useful for chemical vapor disposition (CVD) or etching processes in the fabrication of devices on semiconductor wafers in semiconductor industry.

2. Discussion of Related Art

Plasma sources are an indispensable tool for the present and future semiconductor wafer processing in semiconductor industry. Three important conditions of such sources are higher plasma density, higher radial uniformity of the plasma over the wafer surface, and large-area plasma. In this respect, conventional high density plasma sources have limited applications owing to their design rules. This matter is explained by reference to a helical resonator plasma having a conventional geometry. A schematic diagram of the conventional helical resonator plasma source producing high density plasma is shown in FIG. 8. Since only the plasma generation process is of interest, a wafer holding stage, a vacuuming port and vacuum components are not shown in FIG. 8. The helical resonator plasma source has a helical coil 51 made of metal and wound around a dielectric tube 52 which is usually made of quartz. One end of the helical coil 51, usually the lower end, is grounded while the other end is open. The length of the helical coil is $L1=\lambda/4$, where $\lambda$ is the wavelength of the rf frequency applied to the helical resonator and n is an integer. A metal cylinder 53, usually made of aluminum, is placed around the helical coil 51. The metal cylinder 53, the helical coil 51, and the dielectric tube 52 are placed coaxially on a top plate 59 of a process chamber 55. This top plate 59 is made of metal and has a circular hole with a diameter equal to the diameter of the dielectric tube 52. A process gas is fed through a gas inlet port 58 formed at the upper end of the dielectric tube 52. An rf power generated from an rf power source 57 is fed to a point 54 on the helical coil 51 through a matching circuit 56. The rf power source 57 operates at a constant frequency that lies usually in the range of 1 MHz to 40 MHz. When the length of the helical coil 51 is taken as an integral multiple of a quarter of the wavelength, the composite structure begins to resonate. At this condition, the electromagnetic field within the helical coil 51 can ignite and maintain a plasma in the dielectric tube 52 at lower pressures.

A wafer holder is arranged at the lower end of the process chamber 55. A wafer to be processed is loaded on the wafer holder. The plasma generated within the dielectric tube 52 is mainly diffused toward the wafer in the process chamber 55 through the circular hole of the top plate 59.

First, a major problem concerning the configuration of the above-mentioned high density plasma source making the helical resonator plasma is in the controllability of radial plasma uniformity. The plasma is generated in the small-diameter dielectric tube 52 and then introduced into the large-diameter process chamber 55. Once the high density plasma enters into the process chamber 55, the plasma generated various species, for example, ions, electrons, etc., diffuse radially outward in addition to their flight downstream. This diffusion process yields a nonuniform plasma density across a radial line of the process chamber 55 as shown in FIG. 8. FIG. 8 shows the plasma density distribution characteristic of the plasma diffused in the process chamber 55. The lateral axis means a distance in a radial direction across the process chamber 55 and the longitudinal axis refers to the plasma density. As shown by the plasma density characteristic curved line 60 in FIG. 8, the plasma density is at a high level at the center position while it is at a low level at the outer edges. Thus, the plasma diffused into the process chamber 55 from the dielectric tube 52 becomes nonuniform in the radial direction of the process chamber 55. Even though a large-diameter dielectric tube is used instead of the dielectric tube 52, the above problem can not be solved. Thus, without additional hardware, for example, magnetic multipole confinement, a radially uniform plasma can not be obtained with the above helical resonator plasma source.

Secondly, the open end of the helical coil 51 has a higher voltage when the helical coil 51 begins to resonate. This higher voltage causes generation of a capacitively coupled plasma that in turn results in sputtering the wall of the dielectric tube 52, which is close to the open end of helical coil 51. This causes a contamination of the plasma.

Because of these qualities, the conventional helical resonator plasma source has limited application in plasma assisted wafer processing, especially in large-area wafer processing. In order to avoid the above mentioned disadvantages, the configuration of helical resonator plasma source has to be improved.

OBJECTS AND SUMMARY

An object of the present invention is to provide a helical resonator plasma source that yields a radially uniform plasma in the downstream and which eliminates the localized sputtering of the dielectric tube wall.

A plasma processing system of the present invention has a helical resonator where a helical coil is placed, and a plasma process chamber where a wafer holder is arranged at a lower position and a wafer to be processed is loaded on the wafer holder. The helical coil 15 is made of a metal with a length of $n\lambda/4$ where n is an integer and $\lambda$ is the wavelength of the rf frequency applied to the helical coil. The plasma processing system further comprises a reactor including the helical resonator and the process chamber, wherein the helical resonator has a vertical bar for introducing a gas, which is fixed to a top plate of the helical resonator and connected to a gas inlet port. A partition wall divides the reactor into the helical resonator and the process chamber. The partition wall is comprised of an outer metal ring, a circular central plate, and a doughnut-shaped dielectric plate between the outer metal ring and the central metal plate. The circular central metal plate is fixed to the top plate using the vertical bar and includes a gas reservoir and a plurality of gas inlet ports. In the above configuration, the helical coil is placed around the vertical bar and has a diameter (D) that satisfies d1<D<d2, where d1 and d2 are the inner and outer diameters of the doughnut-shaped dielectric plate.

In accordance with the plasma processing system, a ring-shaped or doughnut-shaped plasma is generated below the doughnut-shaped dielectric plate in the process chamber. The ring-shaped or annular plasma lies in an annular region, and is diffused in the downstream toward the wafer to become a uniform plasma in the radial direction.

In the plasma processing system, preferably, the central metal plate is electrically grounded or electrically isolated.

In the plasma processing system, the central metal plate is preferably supplied a rf power or a DC bias voltage.

In the plasma processing system, the central metal plate is preferably grounded through an inductor and a variable capacitor connected in series.

In the plasma processing system, the helical coil preferably has several turns, or at least two turns, with its axis extending in a vertical direction.

In the plasma processing system, the lower end of the helical coil, which is closest to the doughnut-shaped dielectric plate, is preferably connected to the ground, while the other end that lies farthest from the dielectric plate is open.

In the plasma processing system, the outer metal ring, the doughnut-shaped dielectric plate, the central metal plate, and the helical coil preferably share the same central axis.

Further, in the above plasma processing system, preferably, the top plate is arranged on a dielectric ring and a metal cover is attached to cover the resonator.

BRIEF DESCRIPTION OF THE DRAWINGS

The plasma processing system in accordance with the present invention, which can yield a high density plasma by the helical coil and has different parameters to control the plasma density, can yield a radially uniform plasma over the wafer, because the plasma is generated at the space below the doughnut-shaped dielectric plate which is a part of the partition wall.

DETAILED DESCRIPTION OF THE PREFERRED EMBODIMENTS

Hereinafter, preferred working examples of the plasma processing system in accordance with the present invention will be explained according to the attached drawings. Through the explanation of the working examples, the details of the present inventions will be clarified.

Working Example 1

Figure 1:
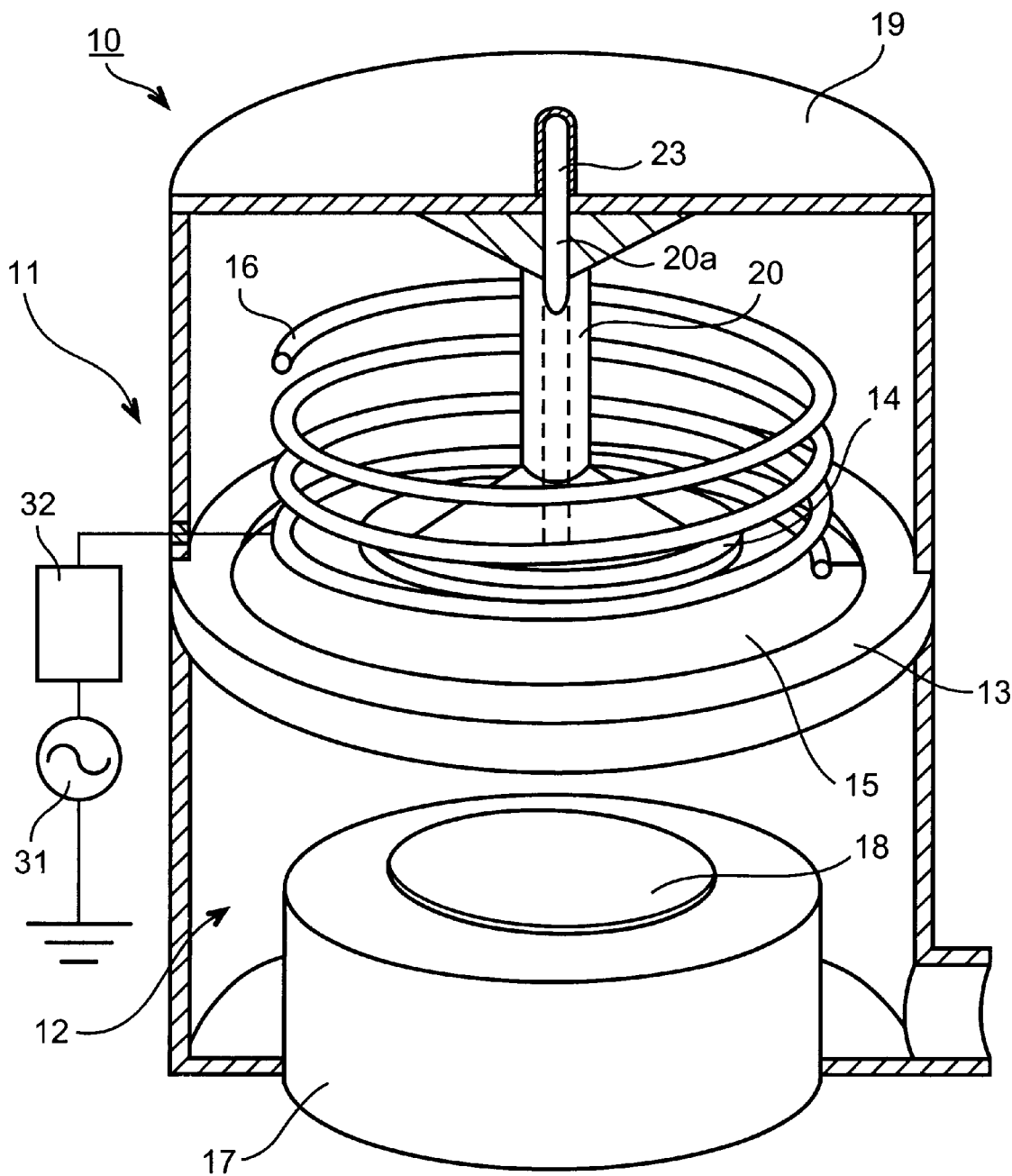
FIG. 1 is a perspective and cross sectional view of a plasma processing system in accordance with the present invention.
Figure 2:
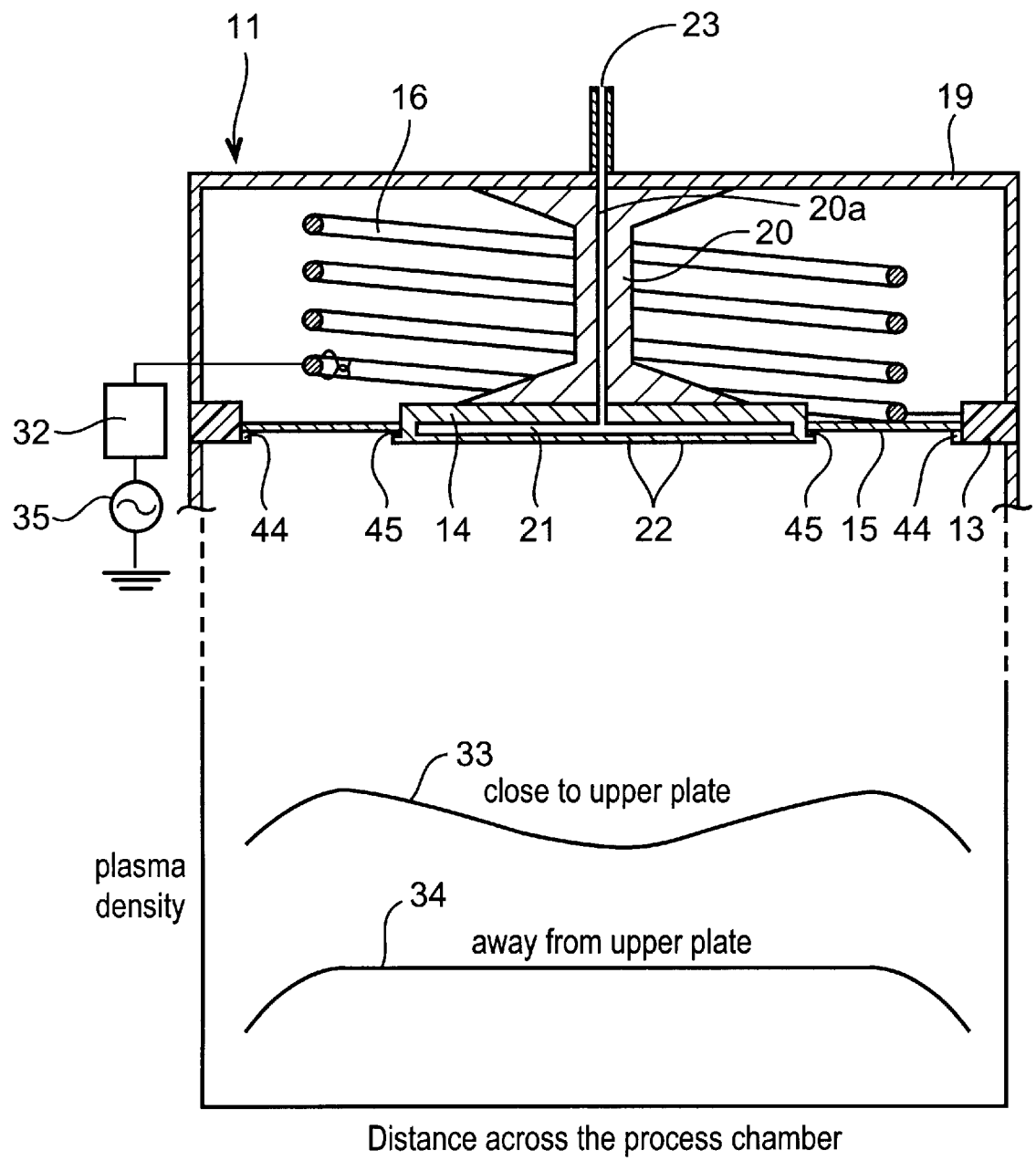
FIG. 2 is a cross sectional view of the upper part of the inventive plasma source and a plasma density distribution of the plasma in the diameter direction of the plasma chamber.

The working example 1 will be explained in accordance with FIGS. 1 and 2. FIG. 1 shows a perspective view of the working example 1, and FIG. 2 shows a cross sectional view of the upper part of the inventive plasma source and a plasma density distribution of the plasma in the diameter direction of the plasma chamber. In FIG. 2, the lateral axis refers to the distance in a radial direction across the process chamber and a longitudinal axis means a plasma density level.

A plasma source 10 in accordance with the working example 1 has a reactor comprising two sections, that is, a resonator 11 and a process chamber 12. The resonator 11 is at an the upper side and the process chamber 12 is at the lower side. The resonator 11 and the process chamber 12 are combined to make the one reactor through a partition wall and also in the aspect of the internal pressure they are separated. The resonator 11 is at atmospheric pressure, while the process chamber 12 is at a low pressure. The lower plate of the resonator 11 also functions as the upper plate of the process chamber 12, and is hereafter called the upper plate of the process chamber 12. This upper plate of the process chamber 12 corresponds to the above-mentioned partition wall and is comprised of an outer metal ring 13, central metal plate 14 and a doughnut-shaped dielectric plate 15 between the outer metal ring 13 and the central metal plate 14. Inside the resonator 11, a helical coil 16 made of a metal is placed with its central axis in a vertical direction. The central axis of the helical coil 16 is identical to the vertical central axis of the cylindrical side wall of the resonator 11. The diameter of the helical coil 16 is relatively large. The inside and outside diameters (d1, d2) of the doughnut-shaped dielectric plate 15 are not critical and are decided based on the dimensions of the process chamber 12. A wafer holder 17 is fixed on the bottom wall of the process chamber 12 and a wafer 18 to be processed is loaded on the wafer holder 17. The above process chamber dimensions depend on the size of the wafer 18, and therefore the diameter d1 and d2 are determined considering the diameter of the wafer 18. Usually, d1 is set to be a value equal to the diameter of the wafer 18. For example, if a reactor for φ200 mm wafer processing is considered, d1 may be around 200 mm. The value of d2 is taken as 40–200 mm larger than d1. The thickness of the doughnut-shaped dielectric plate 15 is not critical and is determined to have a sufficient thickness to withstand the differential pressure between the inside and outside of the process chamber 12. In order to obtain a vacuum sealing, the outer and inner edges of the doughnut-shaped dielectric plate 15 are placed on O-rings 44 and 45.

The central metal plate 14 is usually made of aluminum and is fixed to the top plate 19 of the resonator 11 using a vertical bar 20. The vertical bar 20 is made of metal, for example stainless steel, and has a gas feed passage 20a in its axis section. The height of the vertical bar 20 is adjusted so that both O-rings 44 and 45 which support the dielectric plate 15 are on the same horizontal plane. The central metal plate 14 includes a gas reservoir 21 and a large number of gas inlet ports 22 from the gas reservoir 21 to the process chamber 12. The process gas is initially fed through the main gas inlet port 23 and the gas feed passage 20a. The pressure inside process chamber 12 is maintained usually at a value in the range of 1 mTorr to 200 mTorr. The actual pressure depends on the type of wafer processing.

The outer metal ring 13 is used to support the outer edge of the doughnut-shaped dielectric plate 15. Therefore, the diameter of the outer metal ring 13 depends on the outer diameter of the dielectric plate 15.

For the above helical coil 16 made of a metal, usually copper tubes are used. The length of the helical coil 16 is taken as an integral number of quarter wavelengths of the applied rf frequency. The diameter of the helical coil 16 is about (d1+d2)/2, for example. The lower end of the helical coil 16 is connected to the ground while the upper end is kept open.

The helical coil 16 is provided with an rf frequency electric power from an rf power source 31. The frequency of the rf power source 31 is not critical and preferably is in the region of 1 MHz to 40 MHZ. The rf power source 31 is typically operated at 13.56 MHZ. The rf power source 31 usually has a low impedance, typically about 50Ω and is capable of producing an rf electric power up to about 5 kW. The rf electric power is applied to the helical coil 16 through a matching circuit 32. The position where the rf electric power is tapped on the helical coil 16 is selected to have an easy matching of rf electric power. Usually this point is close to the grounded end of the helical coil 16.

The helical coil 16 typically has a high Q value and a higher impedance $Z_0$. This impedance $Z_0$ typically larger than the rf power source output impedance or the transmission line impedance, which is usually 50Ω. Therefore, by selecting the rf power tap position close to the grounded end, a good rf matching can be obtained. When the helical coil 16 begins to resonate, the induced oscillating magnetic field passes through the doughnut-shaped dielectric plate 15 into the process chamber 12 generating a plasma. This plasma is generated along the doughnut-shaped dielectric plate 15 and has a ring shape or an annular shape. Thus, since the ring-shaped plasma is initially generated below the doughnut-shaped dielectric plate 15, the plasma density close to the upper plate of process chamber 12 is expected to make a distribution characteristic 33 as shown in FIG. 2. In the plasma indicated by the distribution characteristic 33, the plasma density below the doughnut-shaped dielectric plate 15 is high and the plasma density in the rest of the area below the upper plate is low.

This nonuniform plasma diffuses toward the wafer 18 in the plasma chamber 12 and makes a radially uniform plasma in the downstream direction away from the upper plate. The radially uniform plasma is also shown as a plasma density distribution characteristic 34 in FIG. 2.

The grounded end of the helical coil 16 lies close to the doughnut-shaped dielectric plate 15 while the open end thereof lies far from the dielectric plate 15. When the helical coil resonates, its rf current is at a maximum close to the grounded end and is at a minimum at the open end. Again, the rf voltage is at a minimum at the grounded end and is at a maximum at the open end. Since the grounded end, where there is maximum rf current lies just over the dielectric plate, plasma is generated by inductive coupling mechanism. The rf voltage at the grounded end is minimum, therefore, there is no plasma generated by capacitively coupling mechanism. Accordingly, pure inductively coupled plasma is generated with this arrangement of the helical coil. Thus sputtering damages to the doughnut-shaped dielectric plate is minimized.

Working Example 2

Figure 3:
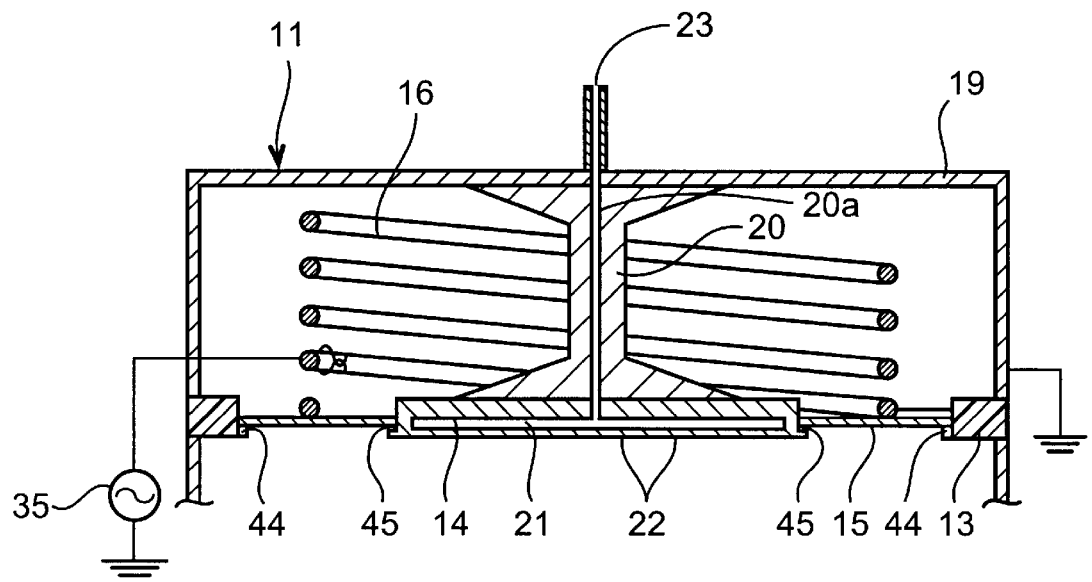
FIG. 3 is a cross sectional view of an upper part of the plasma source in accordance with another embodiment of the present invention.

A working example 2 will be explained in accordance with FIG. 3, where only the resonator section is shown. In FIG. 3, components which are substantially identical to the components explained in the working example 1 are respectively designated with the same reference numerals. The resonator 11 and the process chamber 12 in the working example 2 are the same as given in the working example 1 in the view of the hardware configuration. The only difference is that the rf power source 31 with a constant operating frequency used in the working example 1 is replaced by a variable frequency rf power source 35 and the matching circuit 32 is eliminated. The variable frequency range around a frequency selected in the variable frequency rf power source 35 may usually be in the range of ±10 MHZ. The selected frequency usually is in the range of 1–40 MHz, typically being selected as 13.56 MHZ. Other properties of the rf power source are the same as that explained in the working example 1. Use of a variable frequency rf power source 35 without the matching circuit increases the power transfer efficiency from the rf generator to the plasma.

Working Example 3

Figure 4:
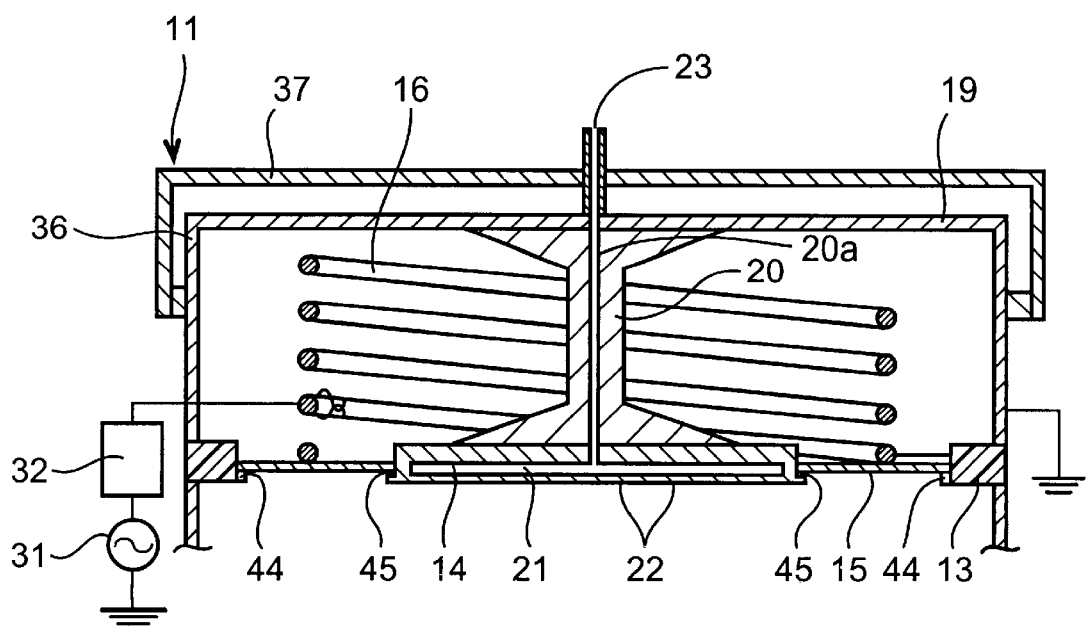
FIG. 4 is a cross sectional view of an upper part of the plasma source in accordance with another embodiment of the present invention.

A working example 3 will be explained in accordance with FIG. 4, where only the resonator section is shown. FIG. 4 shows a schematic view of the working example 3. In FIG. 4 components which are substantially identical to the components explained in the working example 1 are respectively designated with the same reference numerals. In the working example 3, the top plate 19 is placed on a dielectric ring 36 in order to set the central metal plate 14 in a floating state, which is electrically connected to the top plate 19. Except for the addition of this dielectric ring 36 the configuration of the resonator 11 is almost the same as the working examples 1 and 2. However, in order to prevent the propagation of electromagnetic radiation to the outside, a metal case 37 is attached to cover the upper section of the resonator. The rf electrical power to the helical coil 16 may come from the rf power source 31 given in the working example 1, or the variable frequency rf power source 35 given in the working example 2. When the central metal plate 14 is put on the floating state electrically, the electron loss on the central metal plate 14 can be reduced. Because of this reason, the plasma density inside the doughnut-shaped plasma is expected to be increased. This results in a radially uniform plasma at a shorter distance from the central metal plate compared with that of where the central metal plate is grounded.

Working Example 4

Figure 5:
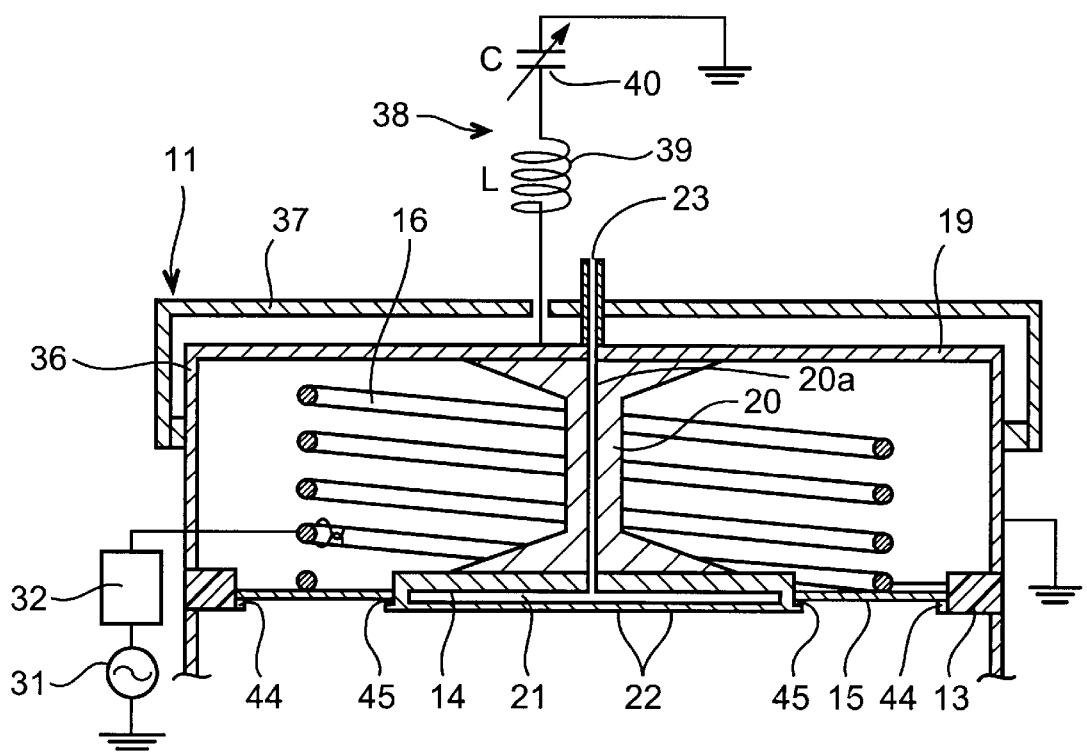
FIG. 5 is a cross sectional view of the upper part of the plasma source in accordance with another embodiment of the present invention.

Working example 4 will be explained in accordance with FIG. 5 where only the resonator section is shown. FIG. 5 shows a schematic view of the working example 4. The working example 4 is an extension of the working example 3. In FIG. 5, components which are substantially identical to the components explained in the working example 3 are respectively designated with the same reference numerals. In the working example 4, an L-C circuit 38 is electrically connected to the top plate 19, which in turn is electrically connected to the central metal plate 14. Usually the L-C circuit 38 is comprised of an inductor 39 and a variable capacitor 40 which are connected in series, so that the resonance frequency of the L-C circuit 38 can be changed to be equal to the frequency of the rf power applied to the helical coil 16. When the resonance frequency of the L-C circuit 38 is equal to the frequency of applied rf power, an rf current flows through the central metal plate 14 to the ground. Further, any dc current or rf current with a different rf frequency other than that applied to the helical coil cannot flow through the central metal plate. This condition makes the central metal plate as a capacitively coupled electrode. Therefore, a secondary plasma is generated in front of the central metal plate. Accordingly, at this condition, there are two plasmas, one plasma below the dielectric plate with a doughnut shape and the other within the inside region of the doughnut-shaped plasma. By the diffusion process, these two plasmas form a radially uniform plasma at a shorter distance from the central metal plate compared with that of without the L-C circuit. Moreover, due to the generation of secondary plasma the average plasma density inside the reactor gets slightly increased.

Working Example 5

Figure 6:
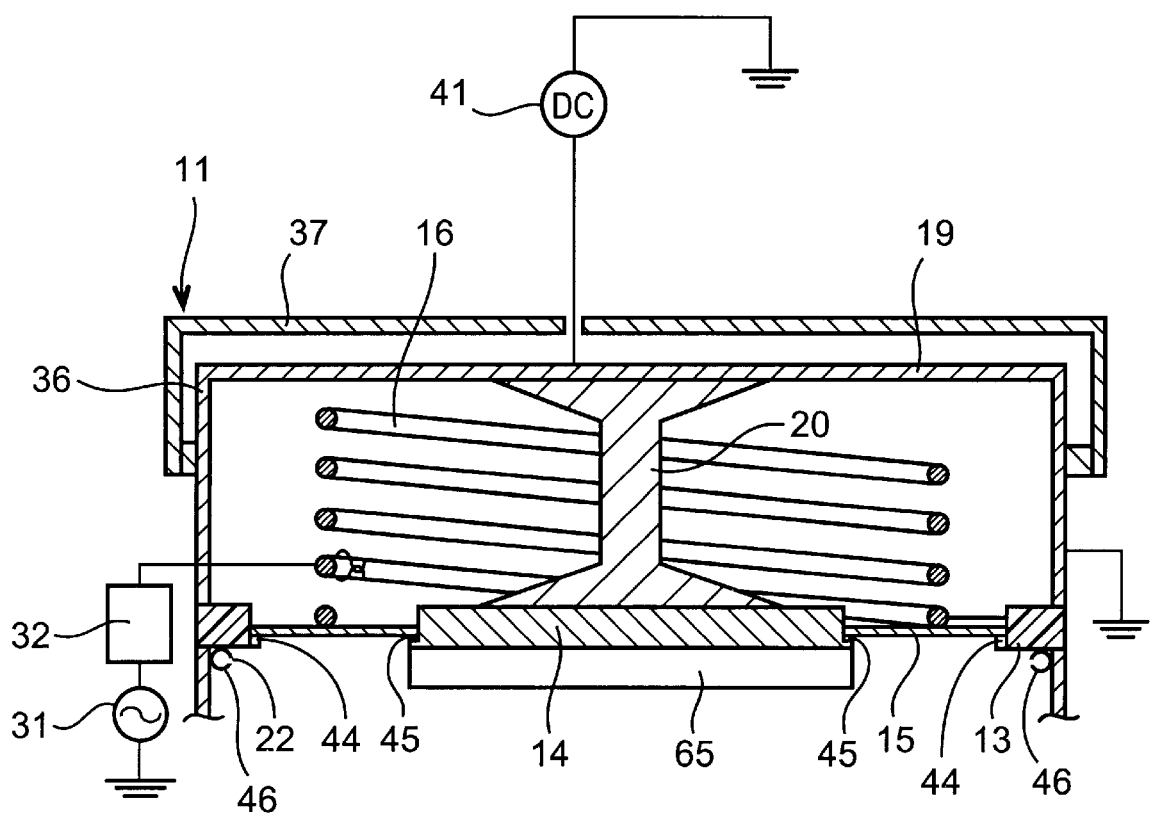
FIG. 6 is a cross sectional view of the upper part of the plasma source in accordance with another embodiment of the present invention.

A working example 5 will be explained in accordance with FIG. 6 where only the resonator section is shown. FIG. 6 shows a schematic view of the working example 5. The working example 5 is a modification of the working example 4. In FIG. 6 components which are substantially identical to the components explained in the working example 4 are respectively designated with the same reference numerals. In the working example 5, a DC power supply source 41 is electrically connected to the top plate 19, and thus electrically connected also to the central metal plate 14, to apply a desired dc voltage to the central metal plate 14. The DC power supply source 41 is capable of delivering a voltage up to 1000 V. This configuration of plasma source is expected to be used in sputter deposition applications. In this case, a target plate 65 is fixed to the central metal plate 14 and a higher negative bias is applied to the central metal plate 14. In working example 5, the main gas inlet port 23, gas feeding passage 20a, gas reservoir 21, and gas inlet ports 22 from the gas reservoir to the process chamber used in the working example 4 are eliminated. Instead, process gas is fed through gas inlets made on a circular tube 46 which is attached to the cylindrical side wall of the process chamber 12. Because of the higher negative bias applied to the central metal plate 14, ions in the plasma accelerate towards the target plate and bombard the target plate with a higher energy that causes sputtering of the target plate. Ion bombardment of the target plate causes a change of plasma density and its radial uniformity. With the bombardment of ions onto the target plate, secondary electrons are emitted from the target plate. The emission of the secondary electrons results in an increase in plasma density. Further, since these secondary electrons are emitted from the target plate which lies inside the doughnut-shaped plasma generated below the dielectric plate, the plasma density inside the doughnut-shaped plasma is increased. This results in a radially uniform plasma at a shorter distance from the central metal plate 14 compared with that of the working example 1.

Working Example 6

Figure 7:
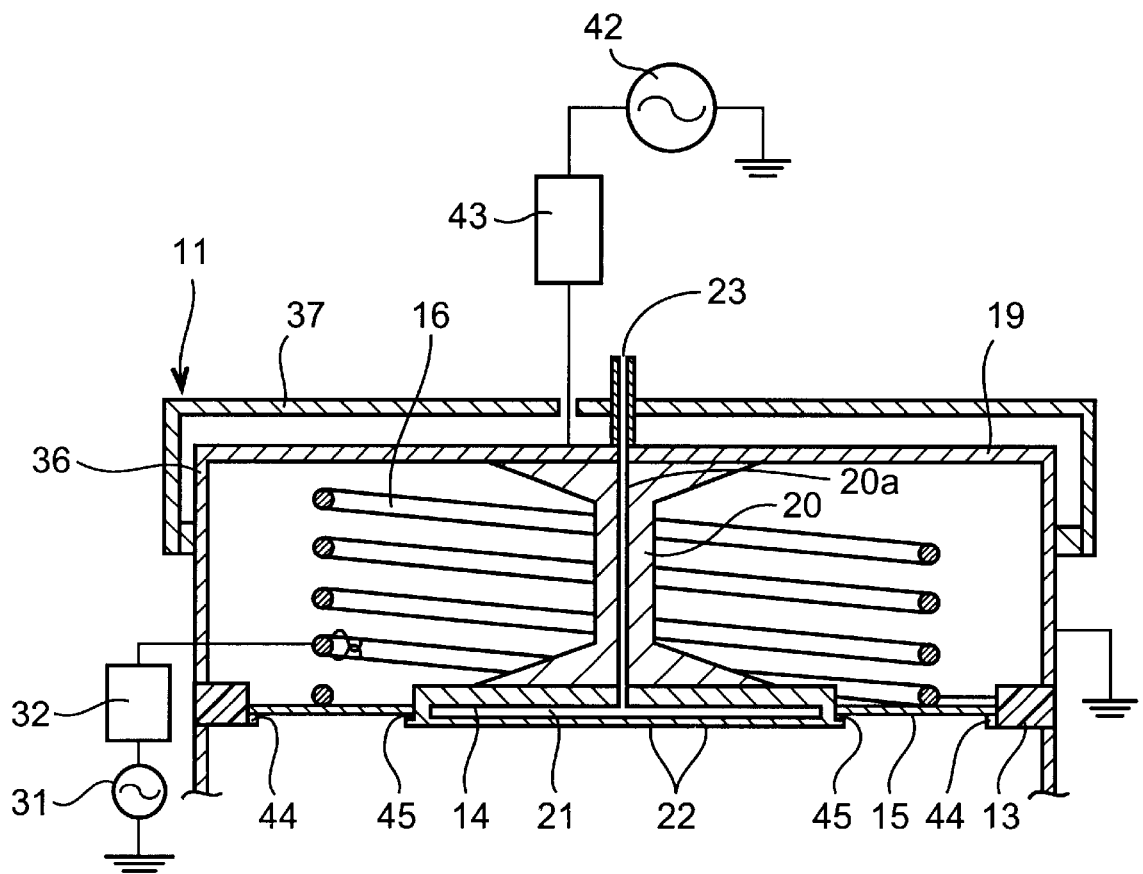
FIG. 7 is a cross sectional view of the upper part of the plasma source in accordance with another embodiment of the present invention.
Figure 8:
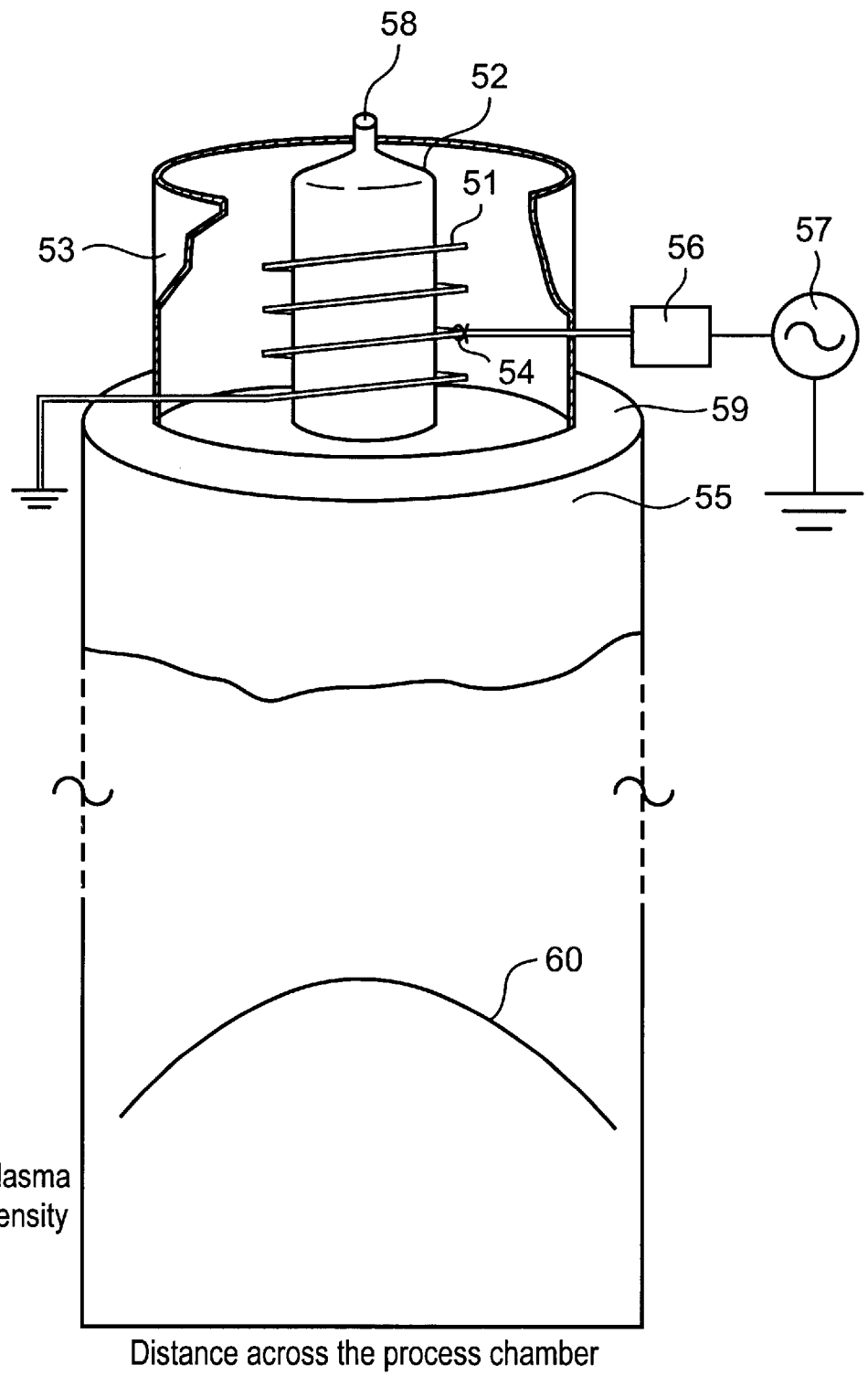
FIG. 8 is an explanatory view showing a typical conventional helical resonator plasma source.

A working example 6 will be explained in accordance with FIG. 7 where only the resonator section is shown. FIG. 7 shows a schematic view of the working example 6. The working example 6 is another modification of the working example 4. In FIG. 7 components which are substantially identical to the components explained in the working example 4 are respectively designated with the same reference numerals. In the working example 6, a second rf power source 42 is electrically connected to the central metal plate 14 through a matching circuit 43 and the upper plate 19. The frequency of the second rf power source 42 may be in the range of 1 MHz to 100 MHZ. This frequency may or may not be equal to that of rf power applied to the helical coil 16. Other properties of the second rf power source 42 are the same as that given in the working example 1. Application of the rf power to the central metal plate 14 causes plasma to be generated below the central metal plate 14 by capacitive coupling mechanism. Since this plasma lies inside the doughnut-shaped plasma generated below the dielectric plate 15, the plasma density inside the doughnut-shaped plasma is increased. This increase results in a radially uniform plasma at a shorter distance from the central metal plate 14 compared with that of the working example 1.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A plasma processing reactor comprising:

a helical resonator including a top plate and a helical coil, the helical coil is made of a metal with a length of $n\lambda/4$, wherein n is an integer and $\lambda$ is a wavelength of rf frequency applied to the helical coil;

a plasma process chamber including a wafer holder arranged at a lower position therein and a wafer to be processed is loaded on the wafer holder;

the helical resonator has a vertical bar for introducing a gas, the vertical bar is fixed to the top plate of the helical resonator and is connected to a gas inlet port; and a partition wall separating the helical resonator and the plasma process chamber, the partition wall being comprised of an outer metal ring, a circular central metal plate, and a doughnut-shaped dielectric plate between the outer metal ring and the central metal plate, the doughnut-shaped dielectric plate having an inner diameter and an outer diameter;

the central metal plate is fixed to the top plate using the vertical bar and includes a gas reservoir and a plurality of gas inlet ports;

the helical coil is placed around the vertical bar; and the helical coil has a diameter that is greater than the inner diameter of the doughnut-shaped dielectric plate and is smaller than the outer diameter of the doughnut-shaped dielectric plate.

2. The plasma processing system as claimed in claim 1, wherein the central metal plate is electrically grounded.

3. The plasma processing system as claimed in claim 1, wherein the central metal plate is electrically isolated.

4. The plasma processing system as claimed in claim 1, wherein the central metal plate is supplied an rf power.

5. The plasma processing system as claimed in claim 1, wherein the central metal plate is supplied a DC bias voltage.

6. The plasma processing system as claimed in claim 1, wherein the central metal plate is grounded through an inductor and a variable capacitor connected in series.

7. The plasma processing system as claimed in claim 1, wherein the helical coil has at least two turns and an axis extending in a vertical direction.

8. The plasma processing system as claimed in claim 1, wherein a lower end of the helical coil is closest to the doughnut-shaped dielectric plate and is connected to the ground while the other end that lies farthest from the dielectric plate is open.

9. The plasma processing system as claimed in claim 1, wherein the outer metal ring, the doughnut-shaped dielectric plate, the central metal plate, and the helical coil share the same central axis.

10. The plasma processing system as claimed in claim 1, wherein the top plate is placed on a dielectric ring.

11. The plasma processing system as claimed in claim 1, wherein the top plate is attached to the helical resonator by means of a dielectric ring.

12. The plasma processing system as claimed in claim 11, wherein a metal case is attached to the reactor so as to cover the helical resonator.

13. The plasma processing system as claimed in claim 4, wherein the top plate is attached to the helical resonator by means of a dielectric ring.

14. The plasma processing system as claimed in claim 13, wherein a metal case is attached to the reactor so as to cover the helical resonator.

15. The plasma processing system as claimed in claim 5, wherein the top plate is attached to the helical resonator by means of a dielectric ring.

16. The plasma processing system as claimed in claim 15, wherein a metal case is attached to the reactor so as to cover the helical resonator.

17. The plasma processing system as claimed in claim 6, wherein the top plate is attached to the helical resonator by means of a dielectric ring.

18. The plasma processing system as claimed in claim 17, wherein a metal case is attached to the reactor so as to cover the helical resonator.

\* \* \* \* \*